US009765897B2

(12) United States Patent
Jee

(10) Patent No.: US 9,765,897 B2
(45) Date of Patent: Sep. 19, 2017

(54) PROCESS CHAMBER GATE VALVE

(71) Applicant: Presys Co., Ltd., Suwon-si (KR)

(72) Inventor: Shin-Young Jee, Suwon-si (KR)

( * ) Notice: Subject to any disclaimer, the term of this patent is extended or adjusted under 35 U.S.C. 154(b) by 0 days.

(21) Appl. No.: 14/390,998

(22) PCT Filed: Apr. 8, 2013

(86) PCT No.: PCT/KR2013/002913
§ 371 (c)(1),
(2) Date: Oct. 6, 2014

(87) PCT Pub. No.: WO2013/151401
PCT Pub. Date: Oct. 10, 2013

(65) Prior Publication Data
US 2016/0305555 A1    Oct. 20, 2016

(30) Foreign Application Priority Data

Apr. 6, 2012    (KR) .................. 10-2012-0035930

(51) Int. Cl.
| *F16K 3/18* | (2006.01) |
| *F16K 51/02* | (2006.01) |
| *H01L 21/67* | (2006.01) |
| *F16K 31/122* | (2006.01) |
| *F16K 31/524* | (2006.01) |
| *H01L 21/677* | (2006.01) |

(52) U.S. Cl.
CPC ............ *F16K 3/184* (2013.01); *F16K 31/122* (2013.01); *F16K 31/52475* (2013.01); *F16K 51/02* (2013.01); *H01L 21/67126* (2013.01); *H01L 21/67742* (2013.01)

(58) Field of Classification Search
CPC .. F16K 3/184; F16K 31/122; F16K 31/52475; F16K 51/02; H01L 21/67742; H01L 21/67126
USPC ...................... 251/193, 203–204, 229, 335.3
See application file for complete search history.

(56) References Cited

U.S. PATENT DOCUMENTS

| 5,330,157 | A | * | 7/1994 | Dern | .......................... F16K 1/24 251/162 |
| 6,237,892 | B1 | * | 5/2001 | Ito | .......................... F16K 3/184 251/203 |
| 6,390,449 | B1 | * | 5/2002 | Ishigaki | .................. F16K 3/184 251/204 |
| 6,966,538 | B2 | * | 11/2005 | Hayashi | .................... F16K 3/16 251/195 |
| 7,066,443 | B2 | * | 6/2006 | Ishigaki | .................. F16K 3/184 251/203 |
| 7,198,251 | B2 | * | 4/2007 | Kondoh | .................. F16K 51/02 251/193 |
| 7,766,305 | B2 | * | 8/2010 | Kim | ........................ F16K 3/184 251/203 |

(Continued)

*Primary Examiner* — John Bastianelli
(74) *Attorney, Agent, or Firm* — Donn K. Harms

(57) ABSTRACT

A gate valve for a process chamber includes a valve blade for closure of an opening communicating to the process chamber. The valve blade is employed to seal the opening in a valve housing. The valve blade moves first in a vertical direction and then in a horizontal direction normal to the opening when sealing against the opening. The valve blade moves first in the horizontal direction and subsequently in a vertical direction when disengaging from the opening.

3 Claims, 7 Drawing Sheets

(56) References Cited

U.S. PATENT DOCUMENTS 9,429,239 B2* 8/2016 Jee .................. F16K 3/182
2011/0089354 A1* 4/2011 Nagao ............... F16K 3/184
251/229

* cited by examiner

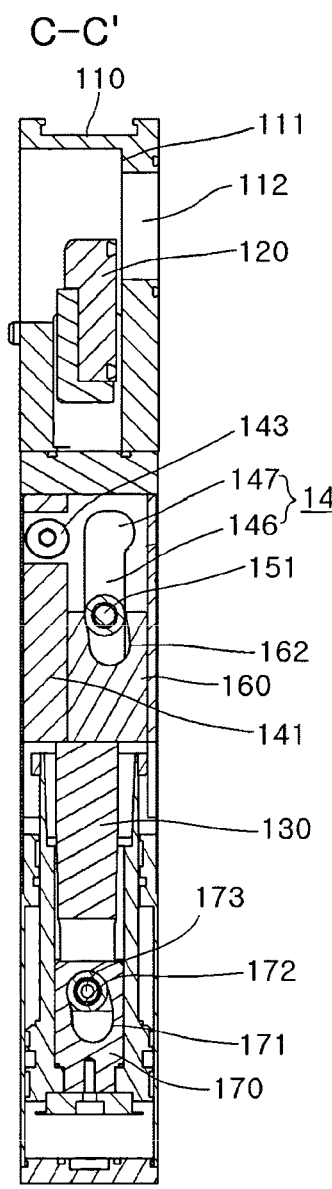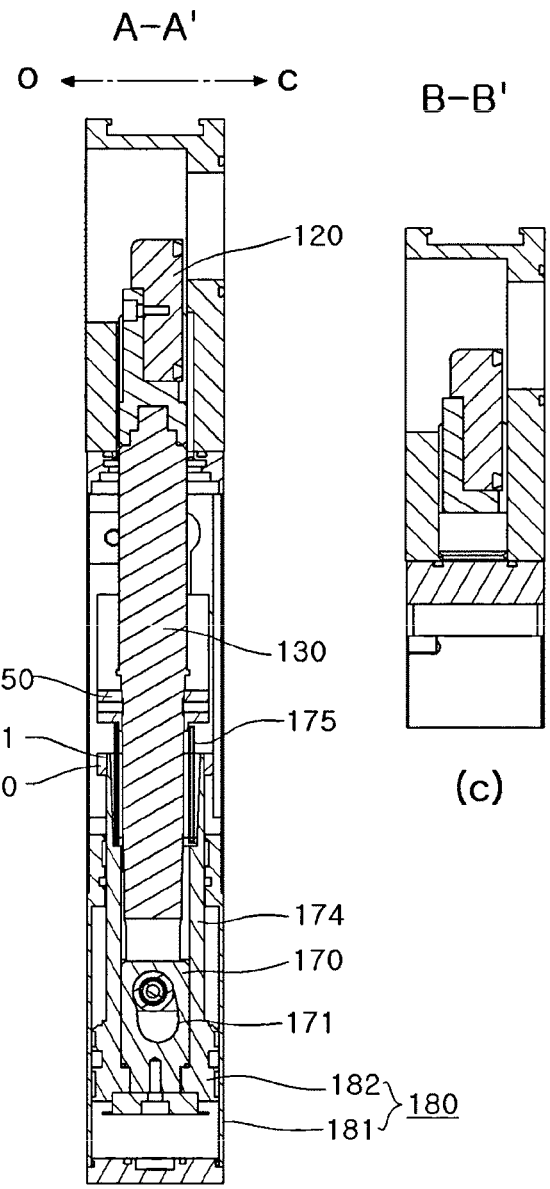
Fig. 5 (a)   Fig. 5 (b)

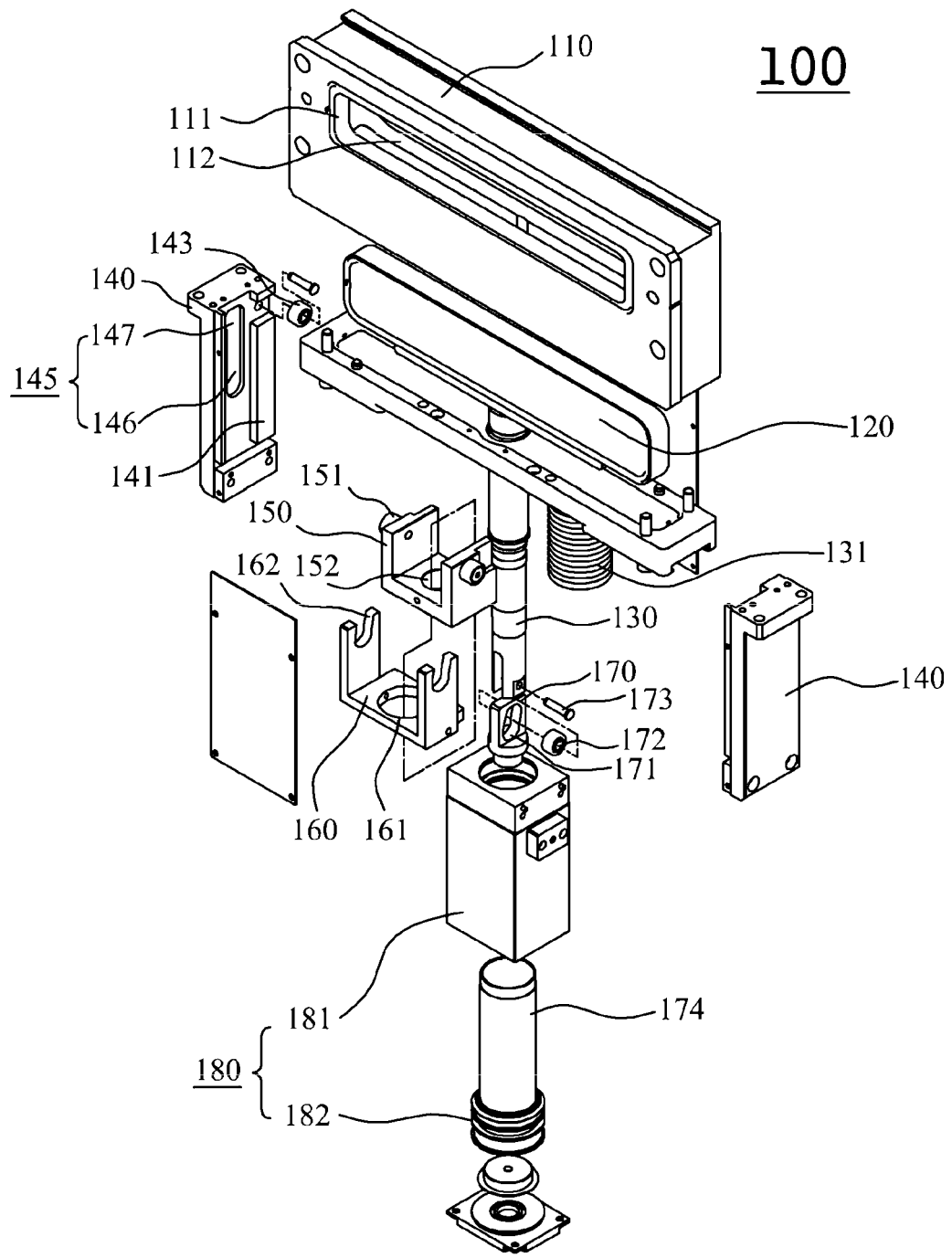
[Fig. 6]

PROCESS CHAMBER GATE VALVE

BACKGROUND OF THE INVENTION

1. Field of the Invention

This application is a U.S. National Stage Application based on International Application Number PCT/KR2013/002913 filed on Apr. 8, 2013, which claims priority to Korean Application Number 10-2012-0035930 filed on Apr. 6, 2012. Both applications are incorporated herein in their entirety by this reference.

The present invention relates to a gate valve, and in particular to a gate valve 100 which comprises a valve blade 120 which comes into close contact with a valve seat 111 formed around an opening 112 in a valve housing 110 and is configured to close the opening 112 from inside; a valve rod 130 which is connected to the valve blade 120 and sealingly protrudes by way of a bellows 131 from the inside of the valve housing 110 to the outside and which moves in an upward and downward direction and moves in a horizontal direction; a guide housing 140 which is connected to an outer side of the valve housing 110; an L-motion block 150 which is installed in the interior of the guide housing 140 and is engaged and connected to the valve rod 130, with a guide roller 151 being installed at both sides of the L-motion block 150; a cam block 160 which is installed in the interior of the guide housing 140 and includes a valve rod pass hole 161 through which the valve rod 130 passes and a slanted groove 162 which is formed at both sides and is obliquely formed in a closing direction "C" in a downward direction, with the guide roller 151 being inserted in and guided by the cam block 160; a driving rod engaging roller 172 which is installed at an lower end of the valve rod 130; a driving rod 170 in which the driving rod engaging roller 172 is inserted and guided and which has a driving rod slanted groove 171 obliquely formed in a closing direction "C" in a downward direction and is engaged to the cam block 160; an elasticity providing unit 175 which is configured to provide elasticity between the L-motion block 150 and the driving rod 170; and an upward and downward driving unit 180 which drives upward and downward the driving rod 170.

2. Prior Art

The present invention is directed to a gate valve which is configured to open or close a transfer passage though which an IC (Integrated Circuit) or processed things such as the parts of the IC are transferred from a vacuum process chamber to another vacuum process chamber or is configured to open or close a flow passage of a fluid such as compressed fluid, gas, etc. or an exhaust flow passage.

In an apparatus for processing a semiconductor wafer or a liquid crystal substrate, the semiconductor wafer or the liquid crystal substrate is inserted or withdrawn from a variety of process chambers by way of a communication passageway. A gate valve is typically installed in the communication passageway in order to open or close it.

As an example of the gate valve, many kinds of gate valves are disclosed. As a representative example of such a gate valve, there is the Korean patent registration number 10-0338163 of the patent document 1 (title of the invention "gate valve").

The gate valve of the above-mentioned patent document 1 is characterized in that a valve desk in a valve box is configured to freely move toward a portion where separates from or comes into close contact with a valve seat through a valve rod which sealingly protrudes from the valve box by means of an operation unit installed in the valve box. The gate valve allows the valve desk to be pressed against the valve seat in the valve box since the valve rod obliquely moves when the movement of the valve rod is almost finished. The operation unit may be configured to connect the piston rod and the valve rod of the piston-cylinder apparatus with the aid of the roller and the slanted, longitudinal hole which is configured to guide the roller or may be configured to connect the ends of them with the aid of a slanted link which freely pivots the rotations.

As illustrated in FIG. 1a, the related gate valve is characterized in that the valve desk operates along a predetermined operation passageway which is slightly slanted with respect to upward and downward directions and a horizontal direction, so there may be any interferences with a variety of components installed in the interior of the gate valve or impurities produced due to mechanical abrasions may input in the process chamber.

In order to improve the construction of the gate valve which has a slanted, operative passageway, as illustrated in FIG. 1b, there is proposed a construction like the Korean patent registration number 10-2011-0073476 (title of the invention "vacuum valve") of the patent document 2 which allows the valve desk to move in a horizontal direction toward the closing position after it is first driven in an upward direction.

The vacuum valve of the patent document 2 comprises a wall with a valve opening surrounded by a valve seat; at least one valve plate which is arranged in a vacuum region of the vacuum valve (here, the valve plate may be moved from an opening position to an intermediate position in a vertical direction, and it may be moved to from its intermediate position to a closing position in a horizontal direction which is vertical with respect to the vertical direction); at least one valve rod which has a valve plate (the valve rod may be guided out of the vacuum region of the vacuum valve and may move in a vertical direction or a horizontal direction wherein the vertical direction is in parallel with respect to the vertical coordinate of the valve rod); and a vertical drive apparatus and a horizontal drive apparatus which are arranged outside the vacuum region of the vacuum valve (the valve rod may be moved in a vertical direction or a horizontal direction by means of the above apparatuses so as to move the valve plate).

The vacuum valve of the patent document 2 is very efficient in its operative passageway; however for the sake of such an operation, it requires a vertical drive apparatus and a horizontal drive apparatus, and its construction is complicated, and manufacture cost is high. For the sake of accurate opening and closing operations, the vertical drive apparatus and the horizontal drive apparatus should cooperate and operate on accurate timing in set operation sequence. For this cooperation, more complicated elements are necessary.

SUMMARY OF THE INVENTION

Accordingly, it is an object of the present invention to provide a gate valve which is made so as to overcome the problems of the related art and is characterized in that only one driving unit is provided, thus obtaining a reliable structure, and a closing operation may be performed in such a way that the valve plate is moved from an opening position to an intermediate portion in a vertical direction, and then is moved from its intermediate position to a closing position in a horizontal direction which is vertical with respect to the vertical direction or an opening operation may be performed in the sequence reverse to the above mentioned sequence. It is possible to prevent any interference with a variety of components installed in the interior of the gate valve and prevent impurities produced due to mechanical abrasion from entering in the process chamber, thus obtaining efficient operations.

To achieve the above objects, there is provided a gate valve, comprising a valve blade 120 which comes into close contact with a valve seat 111 formed around an opening 112 in a valve housing 110 and is configured to close the opening 112 from inside; a valve rod 130 which is connected to the valve blade 120 and sealingly protrudes by way of a bellows 131 from the inside of the valve housing 110 to the outside and which moves in an upward and downward direction and moves in a horizontal direction; a guide housing 140 which is connected to an outer side of the valve housing 110; an L-motion block 150 which is installed in the interior of the guide housing 140 and is engaged and connected to the valve rod 130, with a guide roller 151 being installed at both sides of the L-motion block 150; a cam block 160 which is installed in the interior of the guide housing 140 and includes a valve rod pass hole 161 through which the valve rod 130 passes and a slanted groove 162 which is formed at both sides and is obliquely formed in a closing direction "C" in a downward direction, with the guide roller 151 being inserted in and guided by the cam block 160; a driving rod engaging roller 172 which is installed at an lower end of the valve rod 130; a driving rod 170 in which the driving rod engaging roller 172 is inserted and guided and which has a driving rod slanted groove 171 obliquely formed in a closing direction "C" in a downward direction and is engaged to the cam block 160; an elasticity providing unit 175 which is configured to provide elasticity between the L-motion block 150 and the driving rod 170; and an upward and downward driving unit 180 which drives upward and downward the driving rod 170.

In addition, there are further provided a cam block guide 141 which is installed at both inner sides of the guide housing 140 and is configured to guide the cam block 160 to operate only in upward and downward direction; and a cam block guide roller 143 which is installed at one side or at both inner sides of the guide housing 140 to position on top of the cam block guide 141 and is configured to guide the cam block 160 to operate only in upward and downward directions.

In addition, there are further provided an L-motion guide groove 145 which includes an upward and downward driving section groove 146 which is formed at either inner side of the guide housing 140 and in which the guide roller 151 is inserted and guided and which is formed at upper and lower sides, and an opening and closing driving section groove 147 which is continuously formed in a horizontal direction in a closing direction "C" on top of the upward and downward driving section groove 146; and a cylindrical connection unit 174 to an inner side of the lower surface to which the lower side of the driving rod 170 is connected, and the upper side is engaged to the valve rod pass hole 161, with the elasticity providing unit 175 being installed along its inner circumferential surface; and wherein the upward and downward driving unit 180 further includes a piston 182 which is installed in the interior of the cylinder 181 and moves upward and downward by pneumatic and is connected to the driving rod 170 in an upward direction.

Advantageous Effects

The present invention is advantageous in the way that there is provided only one driving unit, thus obtaining a reliable structure, and a closing operation may be performed in such a way that the valve plate is moved from an opening position to an intermediate position in a vertical direction, and then is moved from its intermediate position to a closing position in a horizontal direction which is vertical with respect to the vertical direction or an opening operation may be performed in the sequence reverse to the above mentioned sequence. It is possible to prevent any interference with a variety of components installed in the interior of the gate valve and prevent impurities from mechanical abrasion from entering the process chamber, thus obtaining efficient operations.

BRIEF DESCRIPTION OF DRAWINGS

FIGS. 5a and 5b are side, cross sectional views illustrating each portion of a gate valve according to an exemplary embodiment of the present invention.

FIG. 6 is a disassembled perspective view illustrating an engagement of major components of a gate valve according to an exemplary embodiment of the present invention.

DETAILED DESCRIPTION OF THE PREFERRED EMBODIMENTS OF THE INVENTION

Figures 1A, 1B:
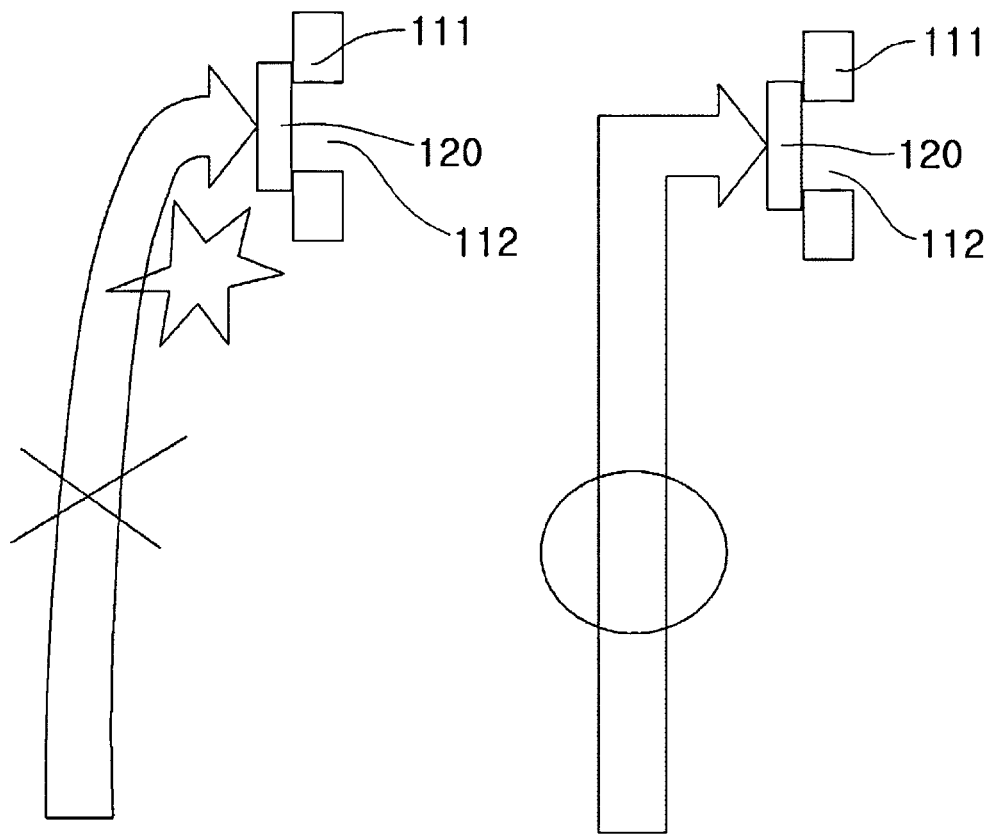
FIGS. 1a and 1b are schematic views illustrating a comparison of an operative passageway of a related gate valve.
Figure 2:
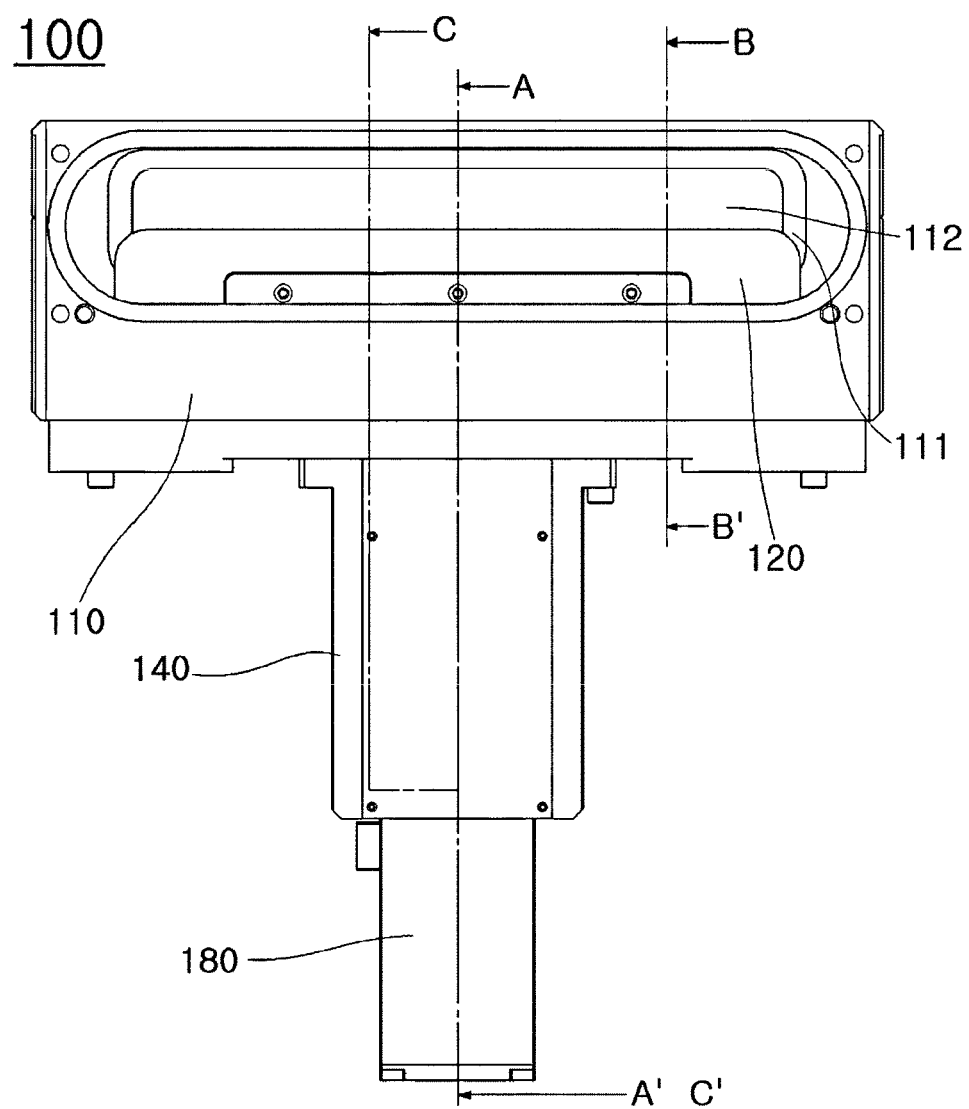
FIG. 2 is a front view illustrating an exterior of a gate valve according to an exemplary embodiment of the present invention.

Now referring to drawings in FIGS. 1-7, there is seen in the figures a gate valve according to an exemplary embodiment of the present invention will be described with reference to the accompanying drawings. In the drawings, it is noted that the same components or parts will be given the same reference numbers. In the course of the description of the present invention, the detailed descriptions on the related functions or construction will be omitted in order to prevent the subject matters of the present invention from becoming ambiguous.

Figure 3:
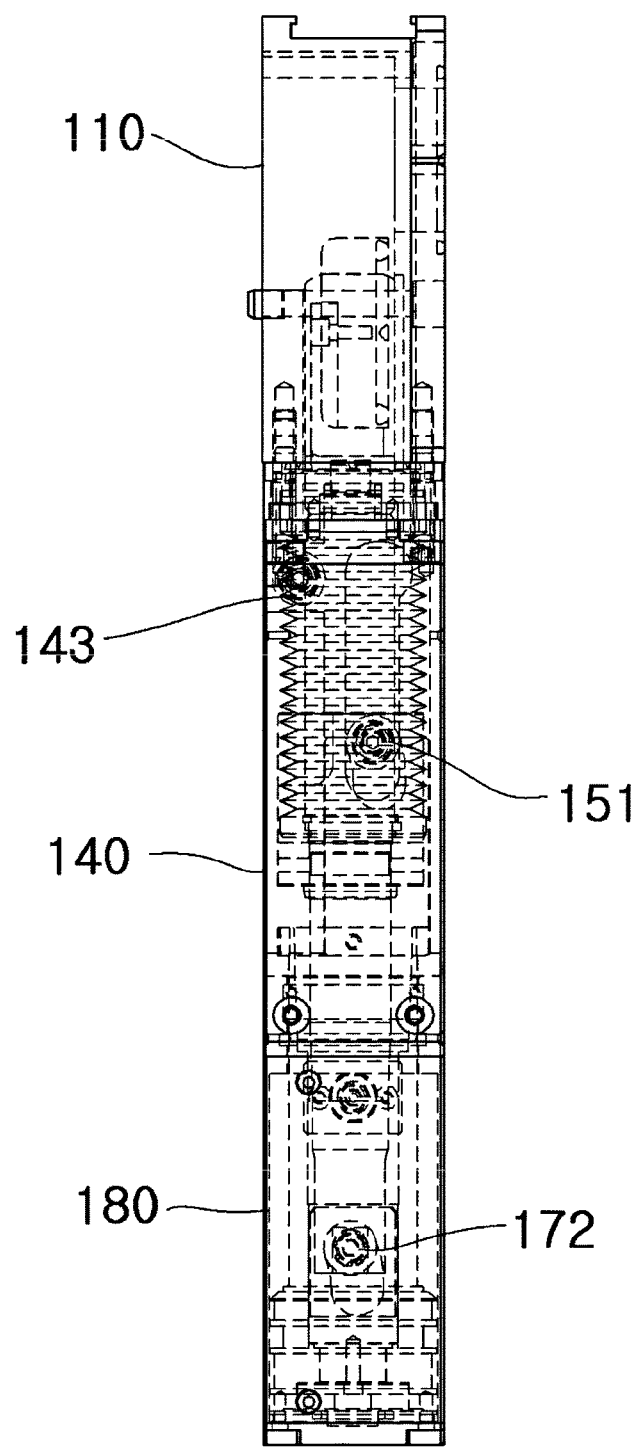
FIG. 3 is a side projection view illustrating an exterior and an interior of a gate valve according to an exemplary embodiment of the present invention.
Figure 4:
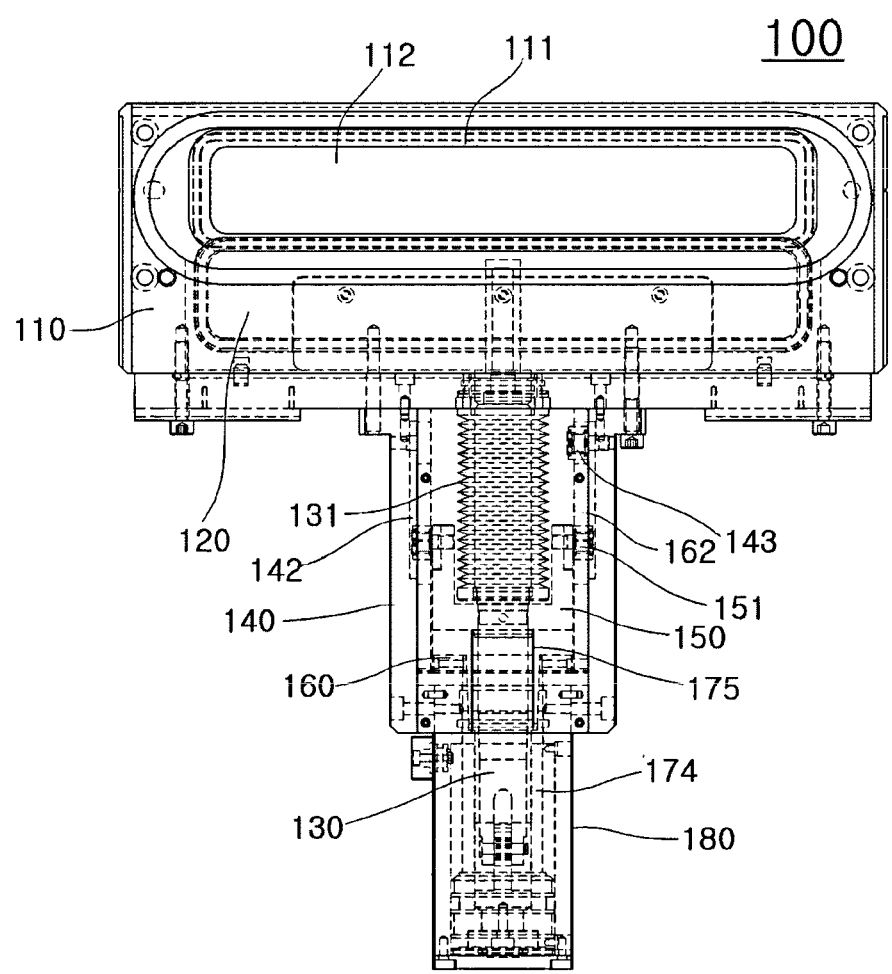
FIG. 4 is a front projection view illustrating an exterior and an interior of a gate valve according an exemplary embodiment of the present invention.

The gate valve according to the present invention, as illustrated in FIGS. 3 and 4, comprises a valve blade 120, a valve rod 130, a guide housing 140, an L-motion block 150, a cam block 160, a driving rod 170 and an upward and downward driving unit 180.

The valve blade 120 will be described. The valve blade, as illustrated in FIG. 5, comes into close contact with a valve seat 111 formed around an opening 112 in a valve housing 110 and has a function of closing the opening 112 from inside. The opening and closing operations of the gate valve 100 of the present invention are performed in such a way that the opening 112 is opened or closed by means of the valve blade 120.

Next, the valve rod 130 will be described. The valve rod 130, as illustrated in FIG. 5, is connected to the valve blade 120 and sealingly protrudes from the interior of the valve housing 110 to the outside by way of a bellows 131 for thereby performing upward and downward movements and a horizontal movement as illustrated in FIGS. 3 and 4.

At a lower end of the valve rod 130, a driving rod engaging roller 172, as illustrated in FIGS. 5 and 6, is installed. The driving rod engaging roller 172 is inserted in a driving rod slanted groove 171 formed in the driving rod 170 and operates in cooperation with the driving rod 170, so the lower and upper sides of the driving rod 130 move upward and downward and move in a horizontal direction.

The guide housing 140 will be described. The guide housing 140, as illustrated in FIGS. 4 and 6, is connected to an outer side of the valve housing 110 and is configured to protect and accommodate the major operative members such as the L-motion block 150 and the driving block 160.

Next, the L-motion block 150 will be described. The L-motion block 150, as illustrated in FIGS. 4 and 6, is installed in the interior of the guide housing 140 and is engaged and connected to the valve rod 130. A guide roller 151, as illustrated in FIGS. 4 and 6, is installed at both sides of the L-motion block 150.

The cam block 160 will be described. The cam block 160, as illustrated in FIGS. 4 and 6, is installed in the interior of the guide housing 140 and includes a valve rod pass hole 151 having a predetermined size big enough to allow the valve rod 130 to easily pass and to be driven in upward and downward directions and a horizontal direction. At both sides of the cam block 160, the guide roller 151, as illustrated in FIGS. 5a and 6, is inserted and guided. There is formed a slanted groove 162 which gradually becomes slanted in the closing direction "C" in a downward direction.

Next, the driving rod 170 will be described. The driving rod engaging roller 172, as illustrated in FIGS. 5 and 6, is inserted in the driving rod 170 and is guided and has a driving rod slanted groove 171 which gradually becomes slanted in the closing direction "C" in a downward direction. The driving rod 170 is engaged to the lower side of the cam block 160 and operates in cooperation with the operations of the driving rod 170, so the cam block 160 is operated.

It is preferred that an elasticity providing unit 175, as illustrated in FIG. 7, is disposed between the L-motion block 150 and the driving rod 170 for thereby obtaining reliable operations during the opening operation. More specifically, in case of the opening operation, the cam block 160 moves downward while the L-motion block 150 moves again horizontally in the opening direction "O". In this case, if the downward movement of the L-motion block 150 is not prevented, the L-motion block 150 is not opened in the horizontal direction, but operates in a downward slanted direction, so erroneous operation or interference may occur. Therefore, it is preferred that the upward and downward movements are prevented until the L-motion block 150 is fully opened in a horizontal direction by means of the elasticity providing unit 175, thus obtaining reliable operations. In this case, the elasticity providing unit 175 may be implemented by any of a variety of exemplary embodiments of the present invention. As an exemplary embodiment, a coil spring, as illustrated in FIG. 7, may be used.

In this case, in order for the elasticity providing unit 175 to be installed between the L-motion block 150 and the driving rod 170 and in order for the driving rod 170 to be efficiently engaged to the lower side of the cam block 160, there is further provided a cylindrical connection unit 174 with the aid of which the lower side of the driving rod 170 may engaged to the inner lower side of the same, and the upper side of the driving rod 170 may be engaged to the valve rod pass hole 161, and the elasticity providing unit 175 may be installed along its inner circumferential surface. In this case, the cylindrical connection unit 174 may be separately manufactured and may be engaged to the driving rod 170. It may be integrated in the driving rod 170 or it, as illustrated in FIG. 6, may be integrated in the piston 182.

Next, the upward and downward driving unit 180 will be described. The upward and downward driving unit 180, as illustrated in FIGS. 4 and 5, has a function of driving upward and downward the driving rod 170. The above mentioned upward and downward driving unit 180 may be implemented in a variety of exemplary embodiments. As an exemplary embodiment of the upward and downward driving unit 180, as illustrated in FIGS. 4 and 5, it is preferred that the upward and downward driving unit 180 is installed in the interior of the cylinder 181 and is driven upward and downward by means of pneumatic. A piston 182 connected to the driving rod 170 may be further provided above the same. In this case, the cylinder 181 is engaged to the lower side of the guide housing 140 and is installed. It is preferred that the gate valve 100 of the present invention is manufactured in an integrated form while providing easier assembling and disassembling procedures for maintenance and repair.

It is preferred that for reliable operations, the cam block 160 is configured to operate only in upward and downward directions, not to move in horizontal direction. In order for the cam block 160 to operate only in upward and downward directions, not to move in a horizontal direction (opening/closing direction), it is preferred that at both inner sides of the guide housing 140, a cam block guide 141 is installed for the cam block 160 to be guided to operate only in upward and downward directions.

In case that the cam block 160 has been already moved upward, and when closing, the cam block 160, as illustrated in FIG. 7, may receive pulling force in the opening direction "O", so load may occur or a predetermined error may occur during operations. It is preferred that on the top of the cam block guide 141, a cam block guide roller 143 may be installed at one or both inner sides of the guide housing 140, wherein the cam block guide roller 143 is configured to guide the cam block 160 to move only in upward and downward directions when the cam block 160 has been already moved upward, so the cam block 160 may be smoothly moved only in upward and downward directions in the region where receives more loads.

In order to support the procedure wherein the guide roller 151 is being inserted and guided in the slanted groove 162, the guide roller 151, as illustrated in FIG. 4, may extend up to either side of the guide housing 140. In this case, at either side of the guide housing 140, as illustrated in FIGS. 5 and 6, there is provided an L-motion guide groove 145 which comprises an upward and downward driving section groove 146 in which the guide roller 151 is inserted and guided, and an opening and closing driving section groove 147 which is continuously formed in a horizontal direction over the upward and downward driving section groove 146 in the closing direction "C". Therefore, the guide roller 51 may be supported and guided by means of the cam block 160 and the guide housing 140.

In this case, the L-motion block guide groove 145 is formed in an upside down "L"-shape when viewing it, namely, it is formed in a "?"-shape.

The operations of the gate valve 100 according to an exemplary embodiment of the present invention will be described.

First of all, the closing operation of the gate valve 100 will be described.

Figures 7A, 7B, 7C:
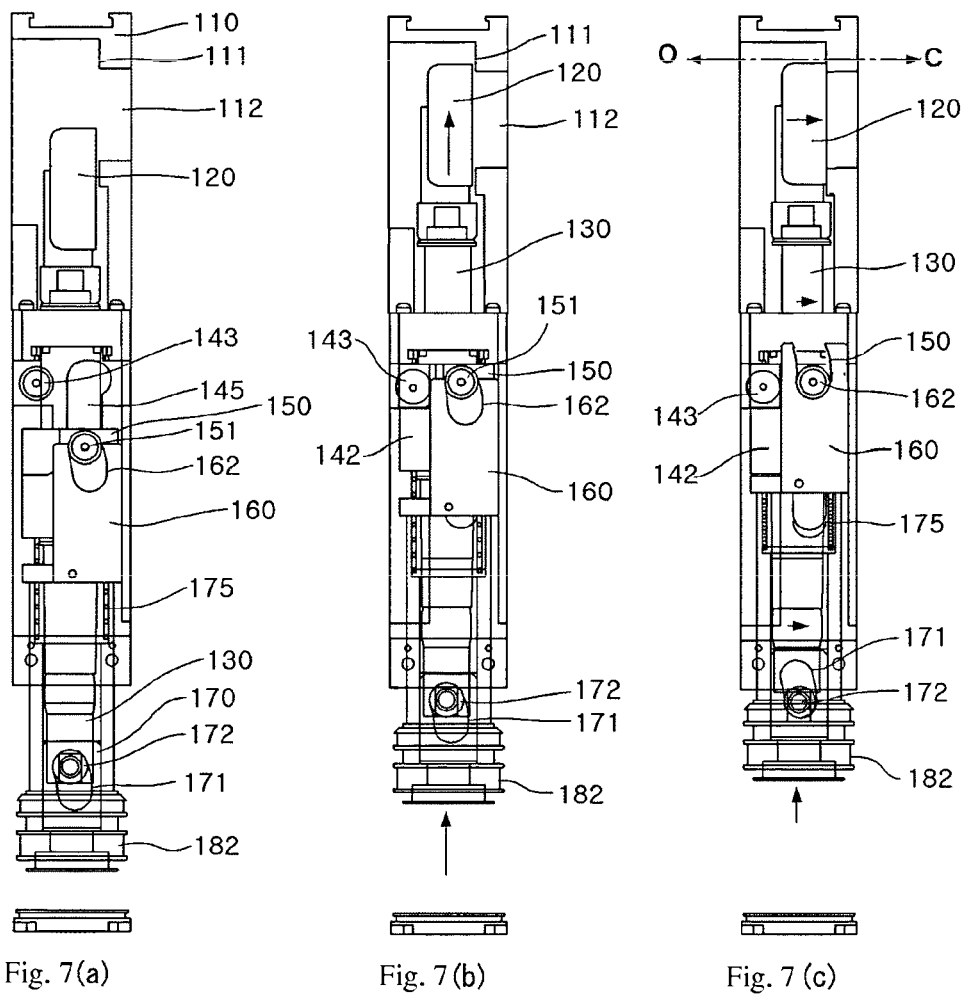
FIGS. 7a, 7b, and 7c show an operation procedure of a gate valve according to an exemplary embodiment of the present invention.

In the opening state as illustrated in FIG. 7a, the upward and downward driving unit 180 is operated, and as illustrated in FIG. 7b, the valve rod 130, the L-motion block 150, the cam block 160 and the driving rod 170 move upward all together until the valve blade 120 moves to the highest position.

Thereafter, as illustrated in FIG. 7c, when the cam block 160 and the driving rod 170 move more upward together, the guide roller 151 of the L-motion block 150 is guided along the slanted groove 162 of the cam block 160, and the L-motion block 150 and the valve rod 130 move horizontally in the closing direction "C".

In this case, the driving rod engaging roller 172 installed at the lower side of the valve rod 130 is guided along the driving rod slanted groove 171, and the lower side of the valve rod 130 is horizontally moved in the closing direction "C".

Since the intermediate portion of the valve rod 130 engaged to the L-motion block 150 and the lower side of the valve rod 130 horizontally move together in the closing direction "C", the vale rod 130 maintains a parallel state with respect to the vertical direction, and the valve blade 120 connected to the upper side of the valve rod 130 closes the opening 112 for thereby finishing a closing operation.

Meanwhile, the opening procedure of the gate valve 100 is performed in the sequence reverse to the closing sequence of the gate valve 100. In this case, as illustrated in FIG. 7b, even though the cam block 160 and the driving rod 170 descend a predetermined distance by means of the elasticity providing unit 175, the L-motion block 150 are prevented from moving upward and downward by means of elastic force from the elasticity providing unit 150 until the L-motion block 150 is fully opened in a horizontal direction, so opening operation can be better performed.

As the present invention may be embodied in several forms without departing from the spirit or essential characteristics thereof, it should also be understood that the above-described examples are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

The invention claimed is:

1. A gate valve, comprising:
   a valve blade 120 which comes into close contact with a valve seat 111 formed around an opening 112 in a valve housing 110 and is configured to close the opening 112 from the inside;
   a valve rod 130 which is connected to the valve blade 120 and sealingly protrudes by way of a bellows 131 from the inside of the valve housing 110 to the outside and which moves in an upward and downward direction and moves in a horizontal direction;
   a guide housing 140 which is connected to an outer side of the valve housing 110;
   an L-motion block 150 which is installed in the interior of the guide housing 140 and is engaged and connected to the valve rod 130, with a guide roller 151 being installed at both sides of the L-motion block 150;
   a cam block 160 which is installed in the interior of the guide housing 140 and includes a valve rod pass hole 161 through which the valve rod 130 passes and a slanted groove 162 which is formed at both sides and is obliquely formed in a closing direction "C" in a downward direction, with the guide roller 151 being inserted in and guided by the cam block 160;
   a driving rod engaging roller 172 which is installed at an lower end of the valve rod 130;
   a driving rod 170 in which the driving rod engaging roller 172 is inserted and guided and which has a driving rod slanted groove 171 obliquely formed in a closing direction "C" in a downward direction and is engaged to the cam block 160;
   an elasticity providing means 175 which is configured to provide elasticity between the L-motion block 150 and the driving rod 170; and
   an upward and downward driving means 180 which drives upward and downward the driving rod 170.

2. The valve of claim 1, further comprising:
   a cam block guide 141 which is installed at both inner sides of the guide housing 140 and is configured to guide the cam block 160 to operate only in upward and downward direction; and
   a cam block guide roller 143 which is installed at one side or at both inner sides of the guide housing 140 to position on top of the cam block guide 141 and is configured to guide the cam block 160 to operate only in upward and downward directions.

3. The valve of either claim 1 or claim 2, further comprising:
   an L-motion guide groove 145 which includes an upward and downward driving section groove 146 which is formed at either inner side of the guide housing 140 and in which the guide roller 151 is inserted and guided and which is formed at upper and lower sides, and an opening and closing driving section groove 147 which is continuously formed in a horizontal direction in a closing direction "C" on top of the upward and downward driving section groove 146; and
   a cylindrical connection unit 174 to an inner side of the lower surface to which the lower side of the driving rod 170 is connected, and the upper side is engaged to the valve rod pass hole 161, with the elasticity providing unit 175 being installed along its inner circumferential surface,
   wherein the upward and downward driving unit 180 further includes a piston 182 which is installed in the interior of the cylinder 181 and moves upward and downward by pneumatic and is connected to the driving rod 170 in an upward direction.

* * * * *